United States Patent
Jo et al.

(10) Patent No.: US 11,177,801 B2
(45) Date of Patent: Nov. 16, 2021

(54) LEAKAGE CURRENT REDUCTION TYPE RADIO FREQUENCY SWITCH DEVICE

(71) Applicant: SAMSUNG ELECTRO-MECHANICS CO., LTD., Suwon-si (KR)

(72) Inventors: Byeong Hak Jo, Suwon-si (KR); Hyun Paek, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 191 days.

(21) Appl. No.: 16/280,923

(22) Filed: Feb. 20, 2019

(65) Prior Publication Data

US 2020/0014380 A1 Jan. 9, 2020

(30) Foreign Application Priority Data

Jul. 9, 2018 (KR) .......................... 10-2018-0079377

(51) Int. Cl.
*H03K 17/16* (2006.01)
*H02H 9/04* (2006.01)

(52) U.S. Cl.
CPC .......... *H03K 17/162* (2013.01); *H02H 9/045* (2013.01)

(58) Field of Classification Search
CPC .................... H03K 17/162; H03K 2217/0018
See application file for complete search history.

(56) References Cited

U.S. PATENT DOCUMENTS

| | | | |
|---|---|---|---|
| 9,231,578 B2 | 1/2016 | Chih-Sheg | |
| 2003/0020546 A1* | 1/2003 | Marra | H03F 1/30 330/296 |
| 2007/0290744 A1 | 12/2007 | Adachi et al. | |
| 2008/0272824 A1 | 11/2008 | Fu et al. | |
| 2014/0049311 A1* | 2/2014 | Yang | H03K 17/162 327/427 |
| 2015/0236749 A1* | 8/2015 | Choi | H03K 17/56 327/419 |
| 2018/0145708 A1 | 5/2018 | Jo et al. | |
| 2019/0305767 A1* | 10/2019 | Ranta | H03K 17/0412 |
| 2019/0305769 A1* | 10/2019 | Willard | H01L 25/0657 |

FOREIGN PATENT DOCUMENTS

| | | |
|---|---|---|
| JP | 2008-11503 A | 1/2008 |
| JP | 5041154 B2 | 10/2012 |
| KR | 10-1823269 B1 | 1/2018 |

* cited by examiner

*Primary Examiner* — Rafael O De Leon Domenech
(74) *Attorney, Agent, or Firm* — NSIP Law

(57) ABSTRACT

A radio frequency switching device includes: a first series switching circuit connected between a first terminal and a second terminal; a first shunt switching circuit connected between one end of the first series switching circuit and a ground; a voltage generation circuit configured to generate a first gate voltage to be output to the first series switching circuit, to generate a second gate voltage to be output to the first shunt switching circuit, and to generate a bias voltage higher than the second gate voltage to control the first shunt switching circuit to enter an off state; a first resistance circuit connected between a signal line between the first terminal and the second terminal, and a bias voltage terminal of the voltage generation circuit; and a second resistance circuit connected between the bias voltage terminal of the voltage generation circuit and a ground terminal of the first shunt switching circuit.

20 Claims, 9 Drawing Sheets

LEAKAGE CURRENT REDUCTION TYPE RADIO FREQUENCY SWITCH DEVICE

CROSS-REFERENCE TO RELATED APPLICATION

This application claims the benefit under 35 U.S.C. § 119(a) of Korean Patent Application No. 10-2018-0079377 filed on Jul. 9, 2018 in the Korean Intellectual Property Office, the entire disclosure of which is incorporated herein by reference for all purposes.

BACKGROUND

1. Field

The following description relates to a radio frequency switching device capable of reducing leakage current.

2. Description of Background

In general, a radio frequency switching device may include a series switching circuit and a shunt switching circuit. Each of the series switching circuit and the shunt switching circuit may include a plurality of MOS transistors connected in series.

Gate voltages supplied to gates of the plurality of MOS transistors are used to control on-off switching. For example, in order to control the plurality of MOS transistors in an on state, a gate voltage higher than a turn-on voltage is supplied, and, in order to control the plurality of MOS transistors in an off state, a gate voltage lower than a turn-off voltage is supplied. For example, the gate voltage lower than the turn-off voltage may be a zero voltage, but in this case, there is a disadvantage in that isolation characteristics may deteriorate.

In order to overcome the disadvantage of the deterioration of the isolation characteristics, a radio frequency switching device including a negative circuit for generating a negative gate voltage has been proposed in order to improve the isolation characteristics by making a more definite off state.

Also, in order to obtain the same effect as the negative gate voltage, a radio frequency switch for supplying a zero voltage to the gate voltage and a bias voltage higher than the gate voltage to a signal line is proposed in order to maintain the shunt switching circuit in an off state. This is described in Korean Patent Registration No. 10-1823269.

However, there is a disadvantage, in that due to the bias voltage supplied to the signal line, both end voltages of the shunt switching circuit, having one end connected to the signal line and the other end connected to the ground, become the bias voltage, such that a leakage current flows to the ground through the shunt switching circuit in the off state. That is, there is a problem in that even when a plurality of MOS transistors in the shunt switching circuit are in an off state, a drain-source resistance is connected between a drain and a source of each of the plurality of MOS transistors, and a current consumption occurs through the drain-source resistance of each MOS transistor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a leakage current reduction type radio frequency switching device includes: a first series switching circuit connected between a first terminal and a second terminal; a first shunt switching circuit connected between one end of the first series switching circuit and a ground; a voltage generation circuit configured to generate a first gate voltage to be output to the first series switching circuit, to generate a second gate voltage to be output to the first shunt switching circuit based on a battery voltage, and to generate a bias voltage higher than the second gate voltage to control the first shunt switching circuit to enter an off state; a first resistance circuit connected between a signal line, which is connected between the first terminal and the second terminal, and a bias voltage terminal of the voltage generation circuit; and a second resistance circuit connected between the bias voltage terminal of the voltage generation circuit and a ground terminal of the first shunt switching circuit.

The first resistance circuit may include a first resistor connected between the bias voltage terminal of the voltage generation circuit and the signal line, and the second resistance circuit may include a second resistor connected between the bias voltage terminal of the voltage generation circuit and the ground terminal.

A first resistance value of the first resistance circuit may be equal to a combined resistance value of the first shunt switching circuit in an off state and a resistance value of the second resistance circuit.

The first series switching circuit may include first to n-th MOS transistors connected in series between the first terminal and the second terminal, and wherein gates of the first to n-th MOS transistors receive a first gate voltage from the voltage generation circuit.

The first shunt switching circuit may include first to n-th MOS transistors connected in series between one end of the first series switching circuit and the ground, and wherein gates of the first to n-th MOS transistors receive a second gate voltage from the voltage generation circuit.

The voltage generation circuit may be configured to control an on state of the first series switching circuit and an off state of the first shunt switching circuit in a signal transfer mode, using the first gate voltage, the second gate voltage, and the bias voltage and to control an off state of the first series switching circuit and an on state of the first shunt switching circuit in a signal off mode, using the first gate voltage, the second gate voltage, and the bias voltage.

In another general aspect, a leakage current reduction type radio frequency switching device may include a first series switching circuit connected between a first terminal and a second terminal; a first shunt switching circuit connected between one end of the first series switching circuit and a ground; a voltage generation circuit configured to generate a first gate voltage to be output to the first series switching circuit, to generate a second gate voltage to be output to the first shunt switching circuit based on a battery voltage, and to generate a bias voltage higher than the second gate voltage to control the first shunt switching circuit to enter an off state; a first resistance circuit connected between a signal line, which is between the first terminal and the second terminal, and a bias voltage terminal of the voltage generation circuit; and a first capacitor circuit connected between a ground terminal of the first shunt switching circuit and the ground to block a direct current.

The leakage current reduction type radio frequency switching device may further include a second resistance circuit connected between the bias voltage terminal of the voltage generation circuit and a ground terminal of the first shunt switching circuit.

The first resistance circuit may include a first resistor connected between the bias voltage terminal of the voltage generation circuit and the signal line, and the second resistance circuit may include a second resistor connected between the bias voltage terminal of the voltage generation circuit and the ground terminal.

A first resistance value of the first resistance circuit may be equal to a combined resistance value of the first shunt switching circuit in an off state and a resistance value of the second resistance circuit.

The first series switching circuit may include first to n-th MOS transistors connected in series between the first terminal and the second terminal in series, and wherein gates of the first to n-th MOS transistors receive a first gate voltage from the voltage generation circuit.

The first shunt switching circuit may include first to n-th MOS transistors connected in series between one end of the first series switching circuit and the ground in series, and wherein gates of the first to n-th MOS transistors receive a second gate voltage from the voltage generation circuit.

The voltage generation circuit may be configured to control an on state of the first series switching circuit and an off state of the first shunt switching circuit in a signal transfer mode, using the first gate voltage, the second gate voltage, and the bias voltage and to control an off state of the first series switching circuit and an on state of the first shunt switching circuit in a signal off mode, using the first gate voltage, the second gate voltage, and the bias voltage.

The first capacitor circuit may include a first capacitor connected between the ground terminal of the first shunt switching circuit and the ground to block a direct current; and an ESD protection circuit connected in parallel to the first capacitor to constantly maintain voltages of both ends of the first capacitor.

The first resistance circuit may include at least a first MOS transistor that is always in an off state to provide an off resistance, wherein the first MOS transistor in the off state is configured to provide an ESD discharge path for protecting the first capacitor circuit from an Electro-Static Discharge (ESD).

In another general aspect, a radio frequency switching device includes a radio frequency switching circuit connected between a first terminal and a second terminal; and a voltage generation circuit to generate a first gate voltage, a second gate voltage, and a bias voltage, which is higher than the second gate voltage, for switching the first radio frequency switching circuit according to a band selection signal.

The voltage generation circuit may include a dynamic bias circuit to input a battery voltage and a reference voltage and to output the bias voltage and a buffer voltage; and a switch control circuit to input the voltage buffer and to output the first gate voltage and the second gate voltage.

The switch control circuit may include a level shifter to shift a voltage level of the band selection signal using the battery voltage and the buffer voltage; and a buffer circuit to generate the first gate voltage and the second gate voltage according to the level-shifter band selection signal.

The radio frequency switching device may include a resistance circuit connected between a bias output terminal of the voltage generation circuit and the radio frequency switching circuit; and a capacitor circuit connected between the radio frequency switching circuit and a ground.

The capacitor circuit may include a constant voltage device and a capacitor connected in parallel.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
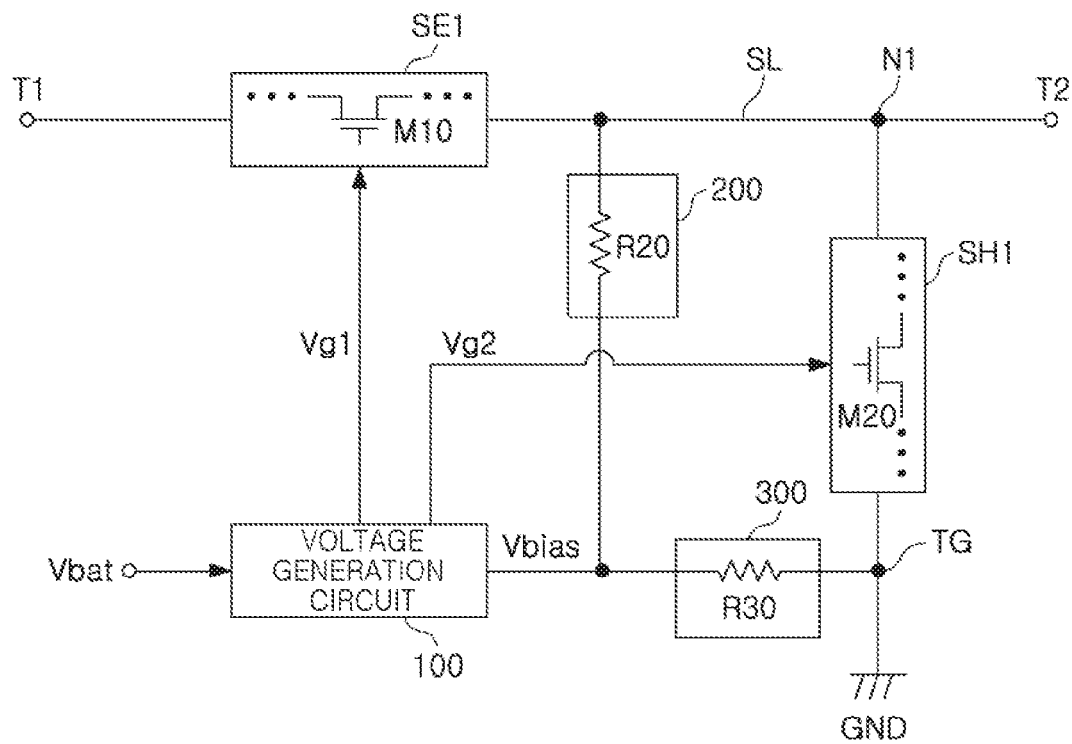
FIG. 1 is a diagram of a radio frequency switching device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on,"

"connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

Figure 2:
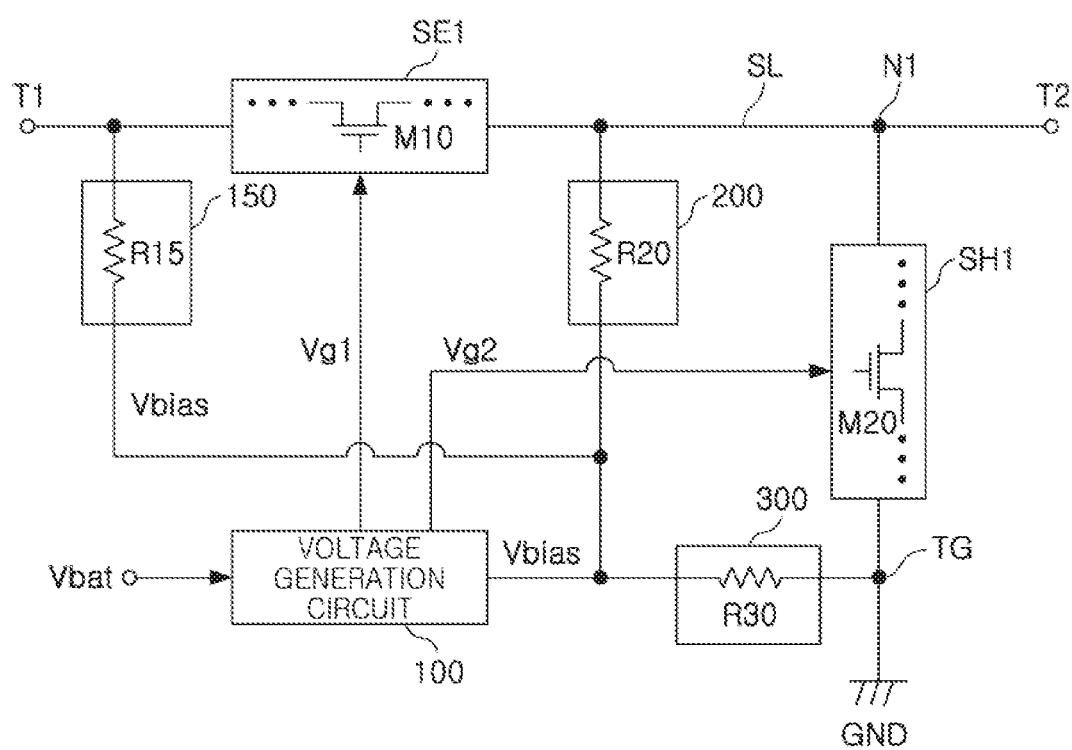
FIG. 2 is a diagram of a radio frequency switching device according to an example.

FIG. 1 is a diagram of a radio frequency switching device according to an example. FIG. 2 is a diagram of a radio frequency switching device according to an example.

Referring to FIGS. 1 and 2, the radio frequency switching device may include a first series switching circuit SE1, a first shunt switching circuit SH1, a voltage generation circuit 100, a first resistance circuit 200 and a second resistance circuit 300.

The first series switching circuit SE1 may include at least a first series transistor M10 connected between a first terminal T1 and a second terminal T2.

The first shunt switching circuit SH1 may include at least a first shunt transistor M20 connected between one end N1 of the first series switching circuit SE1 and ground.

The voltage generation circuit 100 may generate a first gate voltage Vg1 to be output to the first series circuit SE1 and a second gate voltage Vg2 to be output to the first shunt switching circuit SH1 based on a battery voltage Vbat, and generate a bias voltage Vbias (e.g., 1.2 V) higher than the second gate voltage Vg2 (e.g., 0 V) to control the first shunt switching circuit SH1 to enter an off state.

The first resistance circuit 200 may be connected between a signal line SL (e.g., a source of the first shunt switching circuit SH1) between the first terminal T1 and the second terminal T2 and a bias voltage Vbias terminal of the voltage generation circuit 100 and may provide the bias voltage Vbias output from the voltage generation circuit 100 to the signal line SL.

For example, in order to control the first shunt switching circuit SH1 to the off state, the second gate voltage Vg2 may be 0V and the bias voltage Vbias may be 1.2V, and accordingly, with respect to the signal line, there is an effect of supplying a negative voltage to the gate, and thus the first shunt switching circuit SH1 may be in the more definite off state.

The second resistance circuit 300 may be connected between the bias voltage Vbias terminal of the voltage generation circuit 100 and a ground terminal TG of the first shunt switching circuit SH1 and may provide the bias voltage Vbias output from the voltage generation circuit 100 to the ground terminal TG.

For example, the first resistance circuit 200 may include a first resistor R20 connected between the bias voltage Vbias terminal of the voltage generation circuit 100 and the signal line SL. The second resistance circuit 300 may include a second resistor R30 connected between the bias voltage Vbias terminal of the voltage generation circuit 100 and the ground terminal TG.

For example, a first resistance value of the first resistance circuit 200 may be the same as a combined resistance of a resistance value of the first shunt switching circuit SH1 in the off state and a resistance value of the second resistance circuit 300.

In FIG. 1, if potentials of both ends of the first shunt switching circuit SH1 are the same by adding the second resistor R30 of the second resistance circuit 300, a current flowing through both ends of the first shunt switching circuit SH1 is close to 0. However, the current flowing from the bias voltage Vbias terminal to the ground through the second resistance circuit 300 still exists. To minimize this, a value of the second resistor R30 of the second resistance circuit 300 may be sufficiently large. On the other hand, if the second resistance circuit 300 is not applied, a voltage of the one end N1 (or one end of the first shunt switching circuit SH1) of the first series switching circuit SE1 and the bias voltage Vbias are distributed as a ratio of a resistance of the first resistance circuit 200 and an off resistance of the first shunt switching circuit SH1. In this case, the voltage of the one end N1 of the first series switching circuit SE1 may be lower than the bias voltage Vbias.

However, if the second resistor R30 of the second resistance circuit 300 is added, since a current path is not generated (there is no voltage difference), the voltage of the one end N1 of the first series switching circuit SE1 is maintained as the bias voltage Vbias.

An example for removing the current flowing to the ground through the second resistance circuit 300 will be described with reference to FIG. 3.

Referring to FIG. 2, the radio frequency switching device may further include a third resistance circuit 150. The third resistance circuit 150 may be connected between the first terminal T1 and the bias voltage Vbias terminal of the voltage generation circuit 100 and provide the bias voltage Vbias output from the voltage generation circuit 100 to the first terminal T1 (e.g., the drain of the first series switching circuit SE1).

For each drawing figure, unnecessary redundant explanations may be omitted for components having the same reference numeral and the same function, and differences for each figure may be explained.

Figure 3:
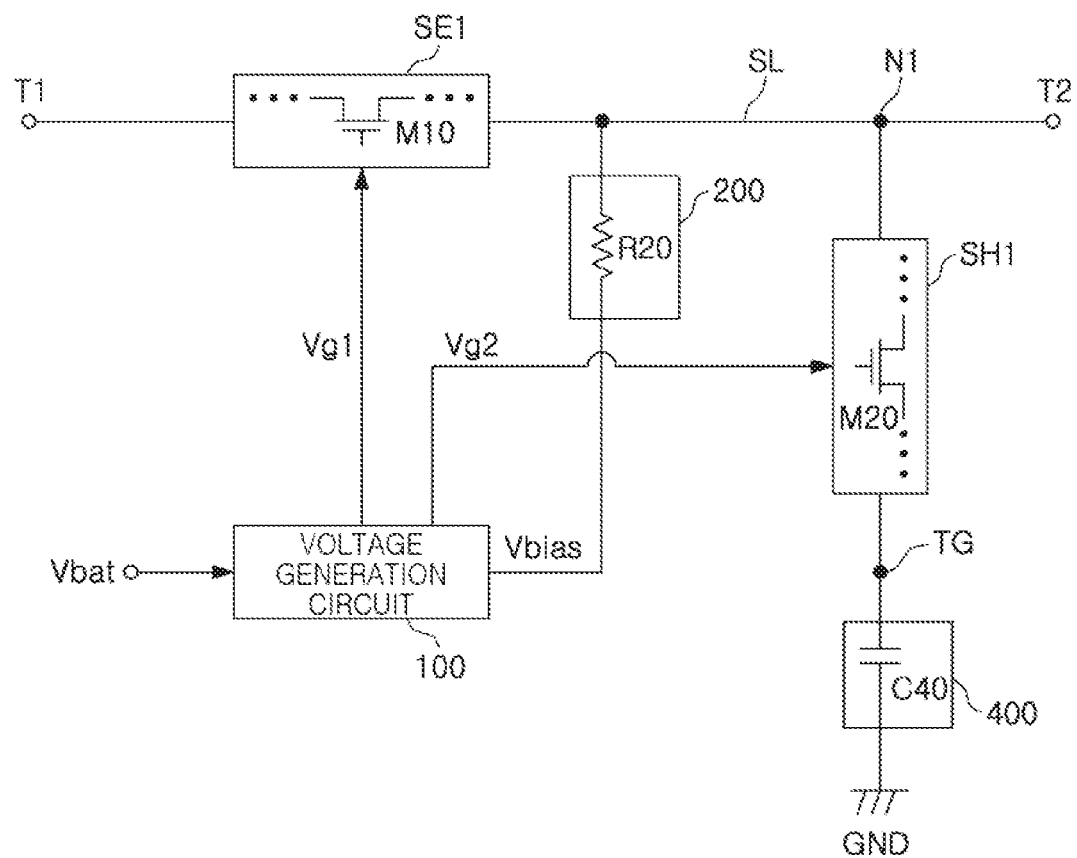
FIG. 3 is a diagram of a radio frequency switching device according to an example.
Figure 4:
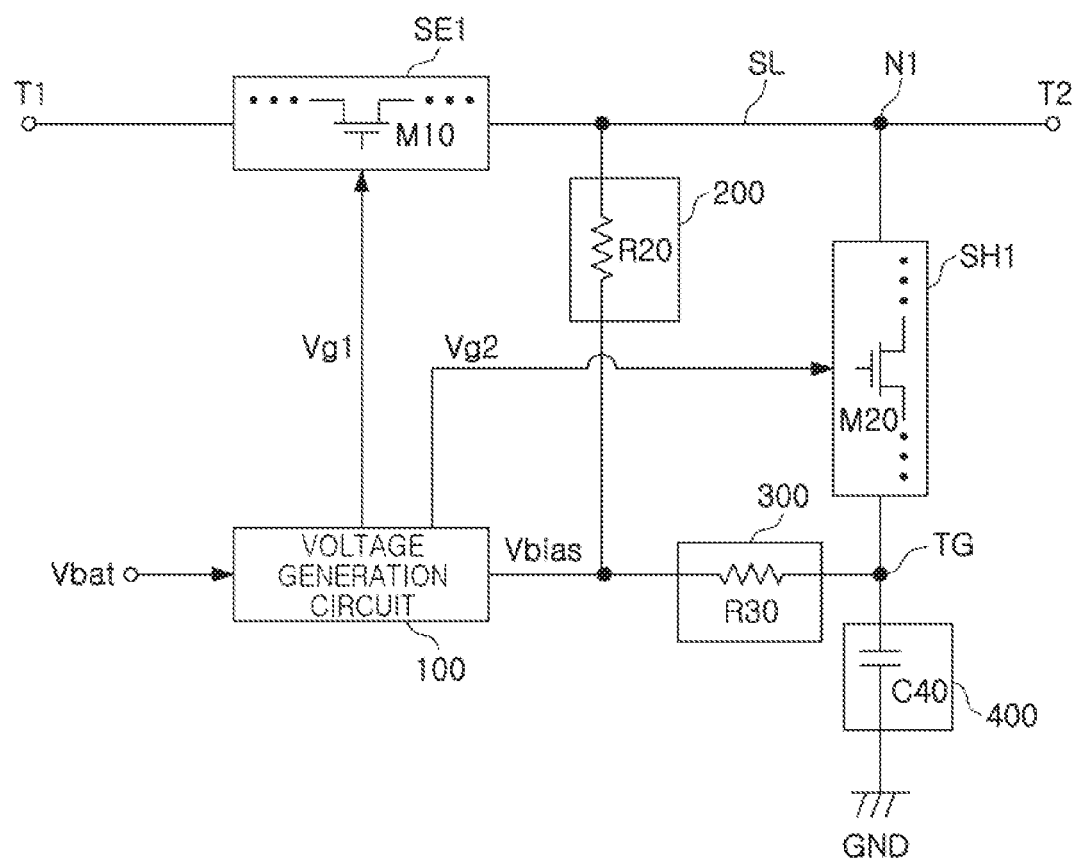
FIG. 4 is a diagram of a radio frequency switching device according to an example.

FIG. 3 is a diagram of a radio frequency switching device according to an example. FIG. 4 is a diagram of a radio frequency switching device according to an example.

Referring to FIGS. 3 and 4, the radio frequency switching device may include the first series switching circuit SE1, the first shunt switching circuit SH1, the voltage generation circuit 100, the first resistance circuit 200, the second resistance circuit 300 (FIG. 4), and a first capacitor circuit 400.

The first series switching circuit SE1 may include at least the first series transistor M10 connected between the first terminal T1 and the second terminal T2.

The first shunt switching circuit SH1 may include at least the first shunt transistor M20 connected between the one end N1 of the first series switching circuit SE1 and ground.

The voltage generation circuit 100 may generate the first gate voltage Vg1 to be output to the first series circuit SE1 and the second gate voltage Vg2 to be output to the first shunt switching circuit SH1 based on the battery voltage Vbat, and generate the bias voltage Vbias (e.g., 1.2 V) higher than the second gate voltage Vg2 (e.g., 0 V) to control the first shunt switching circuit SH1 to enter an off state.

The first resistance circuit 200 may be connected between the signal line SL between the first terminal T1 and the second terminal T2 and the bias voltage Vbias terminal of the voltage generation circuit 100. For example, in order to control the first shunt switching circuit SH1 to the off state, the second gate voltage Vg2 may be 0V and the bias voltage Vbias may be 1.2V, and accordingly, with respect to the signal line, there is an effect of supplying a negative voltage to a gate, and thus the first shunt switching circuit SH1 may be in the more definite off state.

The second resistance circuit 300 may be connected between the bias voltage Vbias terminal of the voltage generation circuit 100 and the ground terminal TG of the first shunt switching circuit SH1.

The first capacitor circuit 400 may be connected between the ground terminal TG of the first shunt switching circuit SH1 and a ground GND to block a direct current.

The first resistance circuit 200 may include the first resistor R20 connected between the bias voltage Vbias terminal of the voltage generation circuit 100 and the signal line SL. The second resistance circuit 300 may include a second resistor R30 connected between the bias voltage Vbias terminal of the voltage generation circuit 100 and the ground terminal TG. The first capacitor circuit 400 may include a first capacitor C40.

A first resistance value of the first resistance circuit 200 may be the same as a combined resistance of a resistance value of the first shunt switching circuit SH1 in the off state and a resistance value of the second resistance circuit 300.

Figure 5:
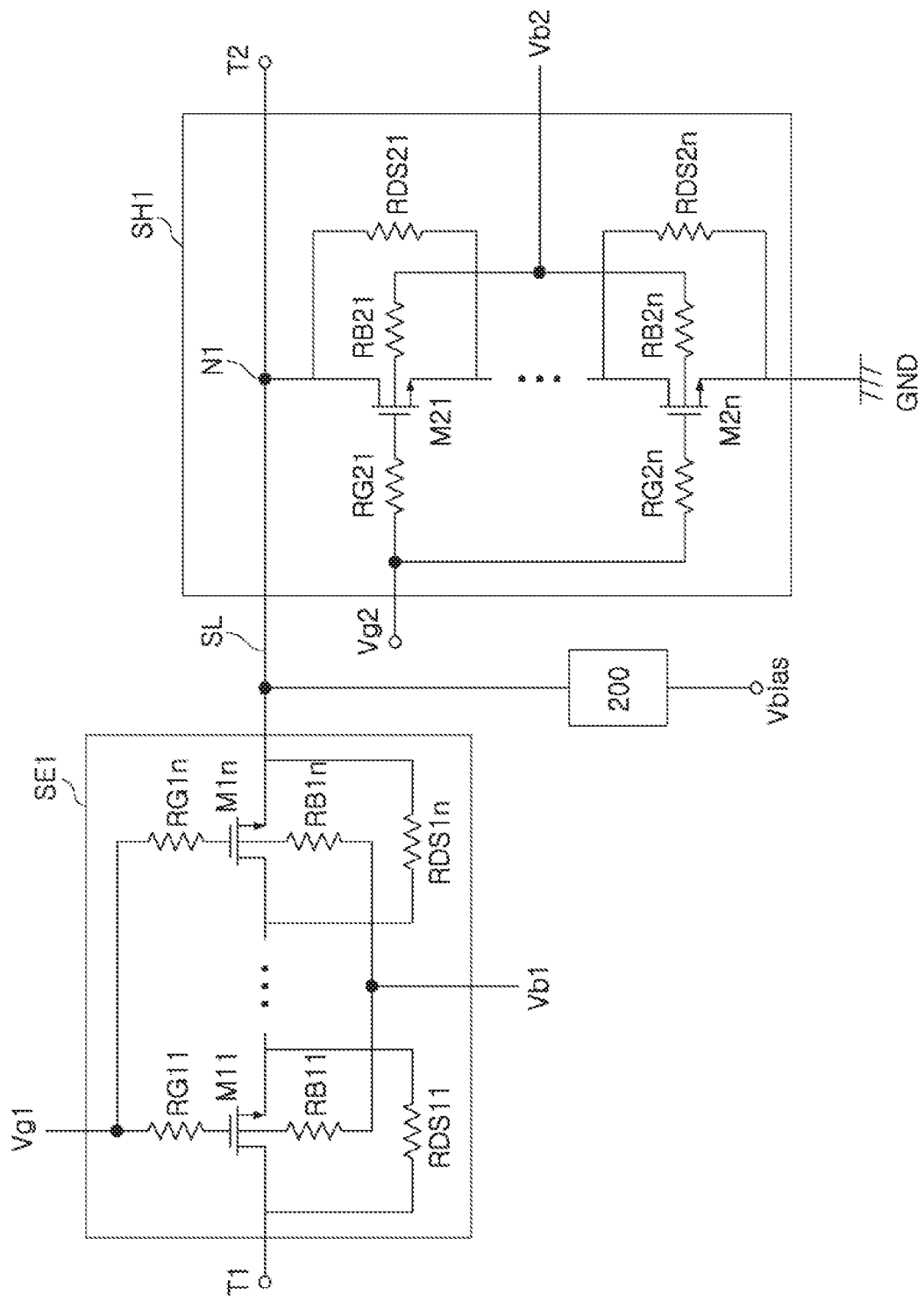
FIG. 5 is a diagram of a first series switching circuit and a first shunt switching circuit according to an example.

FIG. 5 is a diagram of a first series switching circuit and a first shunt switching circuit according to an example.

Referring to FIG. 5, the first series switching circuit SE1 may include first to n-th MOS transistors M11 to M1n connected in series between the first terminal T1 and the second terminal T2. Gates of the first to n-th MOS transistors M11 to M1n may receive the first gate voltage Vg1 from the voltage generation circuit 100.

The first shunt switching circuit SH1 may include first to n-th MOS transistors M21 to M2n connected in series between the one end N1 of the first series switching circuit SE1 and ground. Gates of the first to n-th MOS transistors M21 to M2n may receive the second gate voltage Vg2 from the voltage generation circuit 100.

Referring to FIGS. 1 to 5, the voltage generation circuit 100 may use the first gate voltage Vg1 (e.g., 2.4 V), the second gate voltage Vg2 (e.g., 0 V), and the bias voltage Vbias (e.g., 1.2 V) in a signal transfer mode to control an on state of the first series switching circuit SE1 and an off state of the first shunt switching circuit SH1.

The voltage generation circuit 100 may also use the first gate voltage Vg1 (e.g., 0 V), the second gate voltage Vg2 (e.g., 2.4 V) and the bias voltage Vbias (e.g., 1.2V) in the signal transfer mode to control an off state of the first series switching circuit SE1 and an on state of the first shunt switching circuit SH1.

Figure 6:
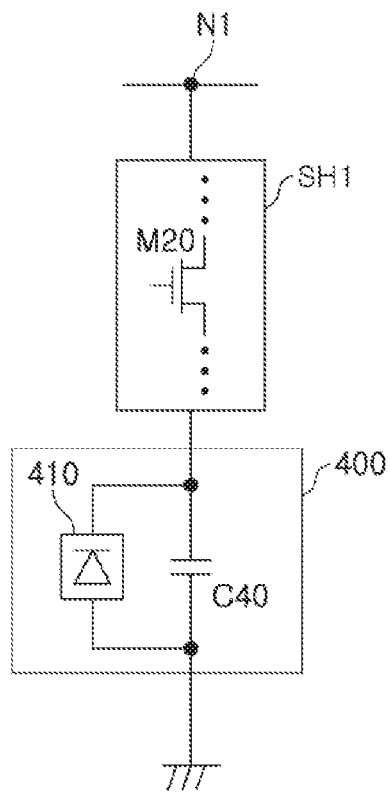
FIG. 6 is a diagram of a first capacitor circuit according to an example.

FIG. 6 is a diagram of a first capacitor circuit according to an example.

Referring to FIG. 6, a first capacitor circuit 400 may include a first capacitor C 40 and an Electro-Static Discharge (ESD) protection circuit 410.

The first capacitor C40 may be connected between a ground terminal of the first shunt switching circuit SH1 and ground to block a direct current.

The ESD protection circuit 410 may be connected in parallel to the first capacitor C40 and may constantly maintain voltages of both ends of the first capacitor C40 so as to protect the first capacitor C40 from overvoltage such as ESD, etc.

For example, the ESD protection circuit 410 may include a constant voltage device such as a diode.

Figure 7:
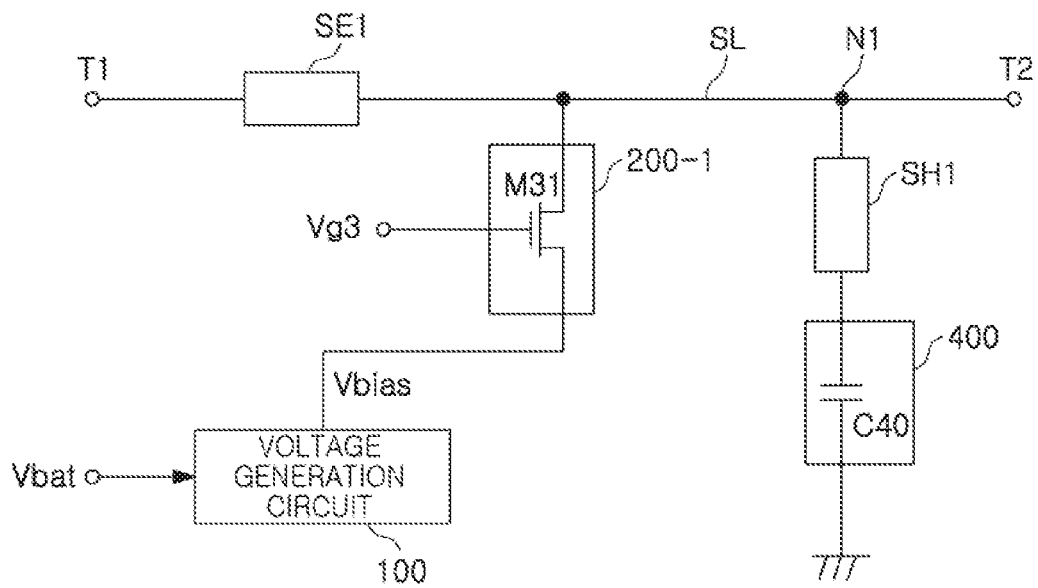
FIG. 7 is a diagram of a first resistance circuit according to an example.

FIG. 7 is a diagram of a first resistance circuit according to an example.

Referring to FIG. 7, a first resistance circuit 200-1 may include at least a switch M31 that is always in an off state to provide an off resistance. The switch M31 may include a MOS transistor, the MOS transistor in the off state may provide an ESD discharge path for protecting the first capacitor circuit 400 from Electro-Static Discharge (ESD).

Referring to FIG. 1, when an ESD event occurs in the second terminal T2, it is discharged through the first shunt switching circuit SH1 to ground. In general, transistors of the first shunt switching circuit SH1 and the first series switching circuit SE1 are configured as relatively large NMOS, and the NMOS of a stack structure that is a structure in which an NPN junction is repeatedly connected may be used as the ESD discharge path, and thus no separate discharge circuit is required.

However, in the case of FIG. 3, when the ESD discharge path by the first shunt switching circuit SH1 and the first series switching circuit SE1 is blocked by the first capacitor circuit 400 and the ESD event occurs, the first capacitor circuit 400 may be broken down.

In order to solve this problem, if the first resistance circuit 200-1 including the switch M31 that is always in an off state is used in the second terminal T2, the switch M31 of the first resistance circuit 200-1 may provide an off resistance and simultaneously provide the ESD discharge path. The resulting ESD discharge path may be discharged to the ground in the voltage generation circuit 100 via the switch M31 from the second terminal T2.

In this case, the voltage generation circuit 100 may include an ESD protection circuit such as a diode for discharging therein.

Figure 8:
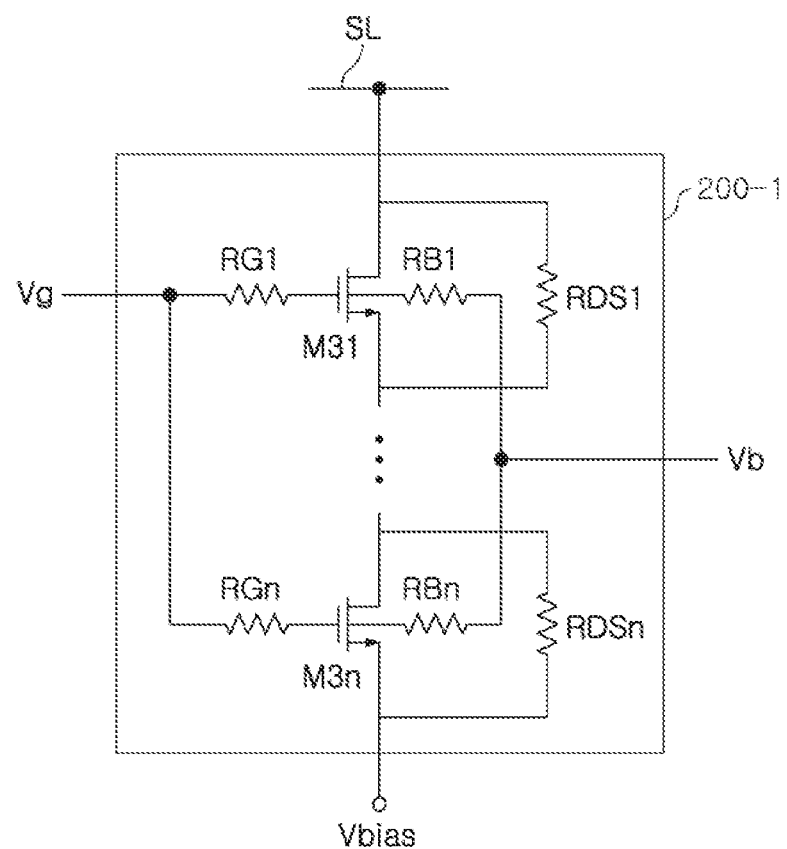
FIG. 8 is an implementation diagram of the first resistance circuit of FIG. 7.

FIG. 8 is a diagram of a first resistance circuit of FIG. 7.

Referring to FIGS. 7 and 8, the first resistance circuit 200-1 may include first to n-th MOS transistors M31 to M3n that are always in an off state and connected in series to provide an off resistance. The first to n-th MOS transistors M31 to M3n in an off state may provide an ESD discharge path to protect the first capacitor circuit 400 from Electro-Static Discharge (ESD).

Figure 9:
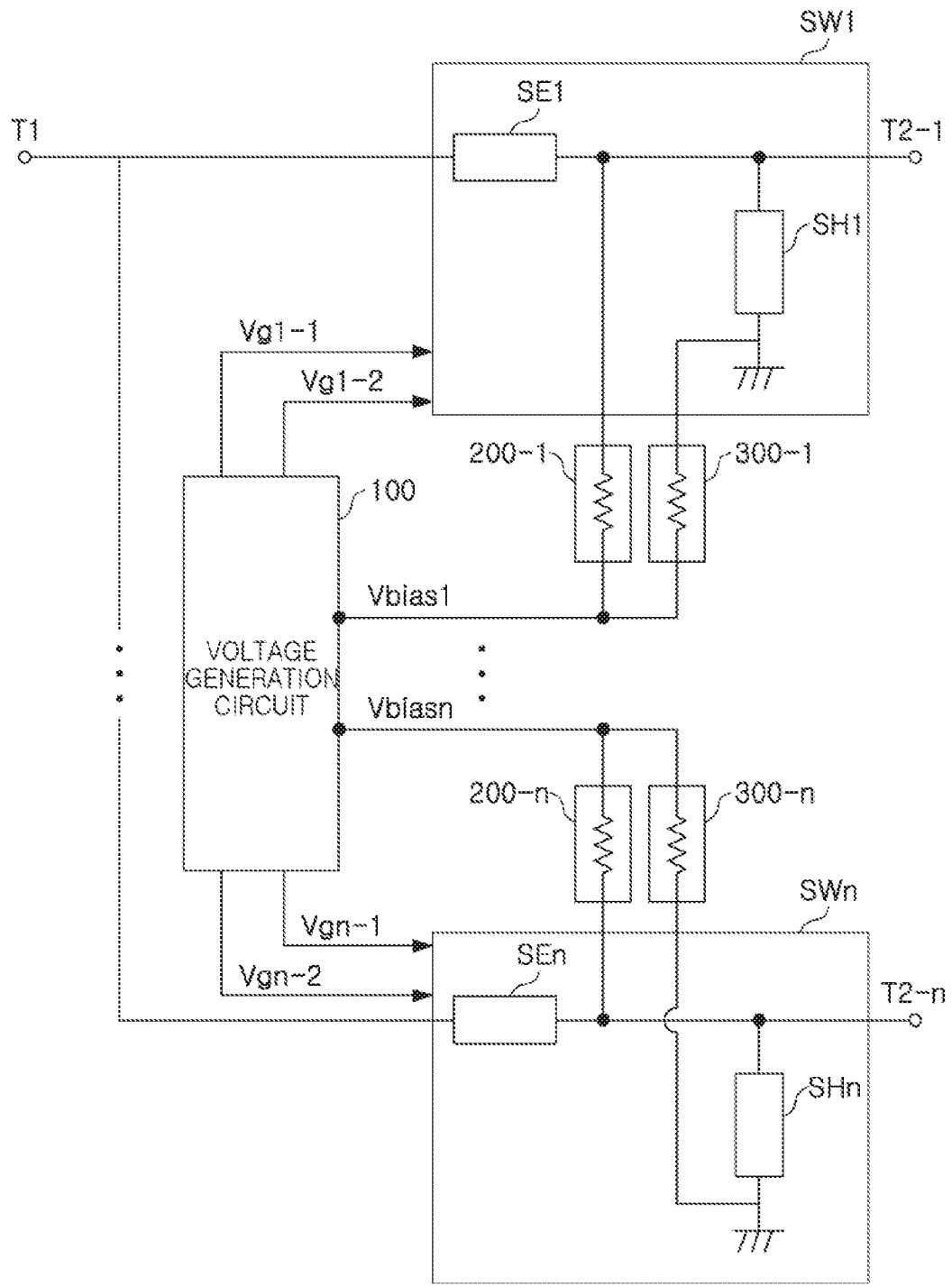
FIG. 9 is a first application of a radio frequency switching device according to an example.

FIG. 9 is a first application example of a radio frequency switching device according to an example.

Referring to FIG. 9, the radio frequency switching device may include a first radio frequency switching circuit SW1 to an n-th radio frequency switching circuit SWn.

Each of the first radio frequency switching circuit SW1 to the n-th radio frequency switching circuit SWn may include series switches SE1 to SEn and shunt switches SH1 to SHn.

The voltage generation circuit 100 may generate and respectively supply gate voltages Vg1-1, Vg1-2 and Vgn-1, Vgn-2 to the first radio frequency switching circuit SW1 to the n-th radio frequency switching circuit SWn, and generate and respectively supply bias voltages Vbias1 to Vbiasn the first radio frequency switching circuit SW1 to the n-th radio frequency switching circuit SWn through first and second resistance circuits 200-1, 300-1 and 200-n, 300-n.

Figure 10:
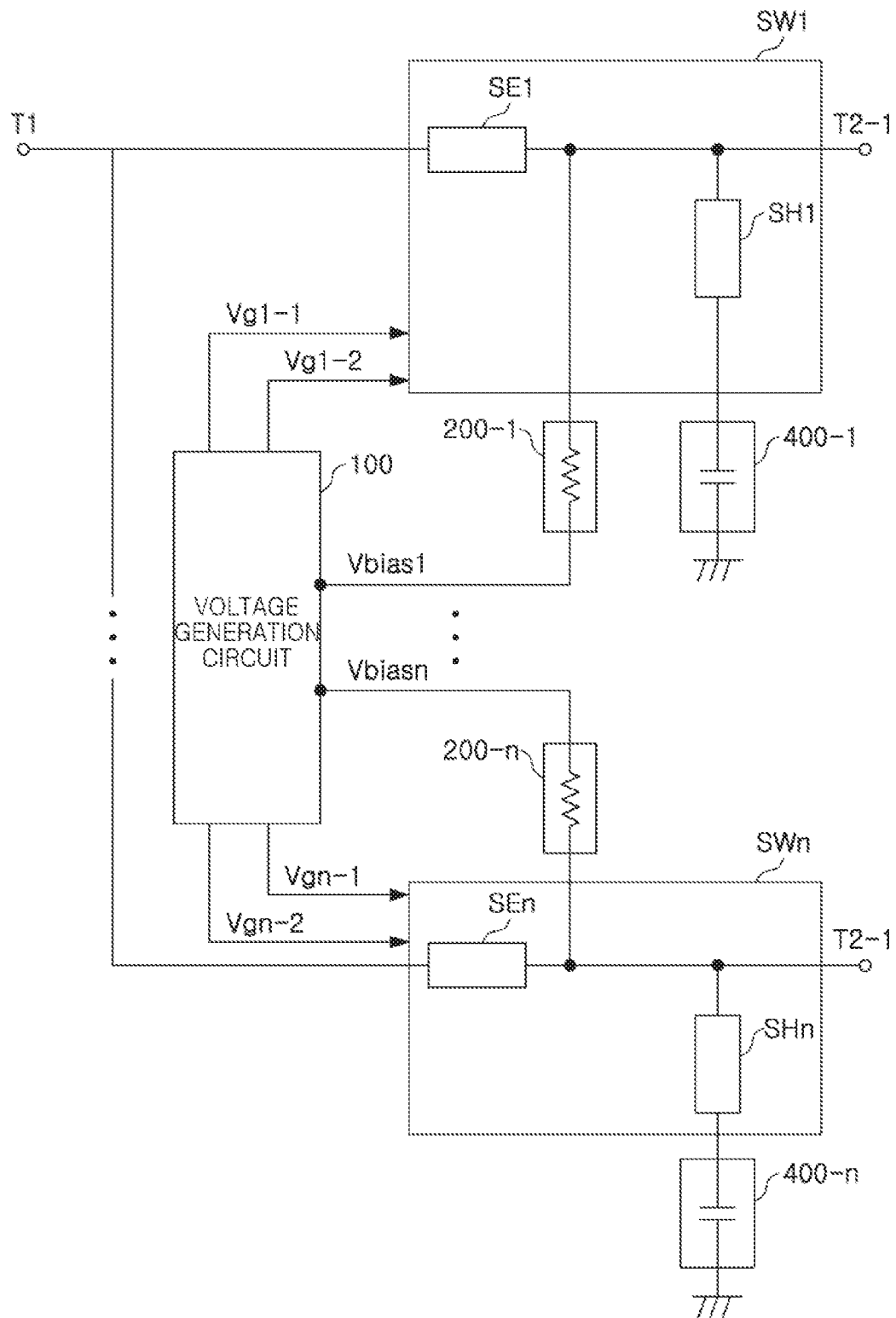
FIG. 10 is a second application of a radio frequency switching device according to an example.

FIG. 10 is a second application example of a radio frequency switching device according to an example.

Referring to FIG. 10, the radio frequency switching device may include the first radio frequency switching circuit SW1 to the n-th radio frequency switching circuit SWn.

Each of the first radio frequency switching circuit SW1 to the n-th radio frequency switching circuit SWn may include the series switches SE1 to SEn and the shunt switches SH1 to SHn.

The voltage generation circuit 100 may generate and respectively supply the gate voltages Vg1-1, Vg1-2 and Vgn-1, Vgn-2 to the first radio frequency switching circuit SW1 to the n-th radio frequency switching circuit SWn, and generate and respectively supply the bias voltages Vbias1 to Vbiasn the first radio frequency switching circuit SW1 to the n-th radio frequency switching circuit SWn through the first resistance circuits 200-1 to 200-n.

The radio frequency switching device may include first to n-th capacitor circuits 400-1 to 400-n.

Each of the first to n-th capacitor circuits 400-1 to 400-n may be connected between the ground terminal TG of each of the first to n-th shunt switching circuits SH1 to SHn and the ground GND to block a direct current.

Figure 11:
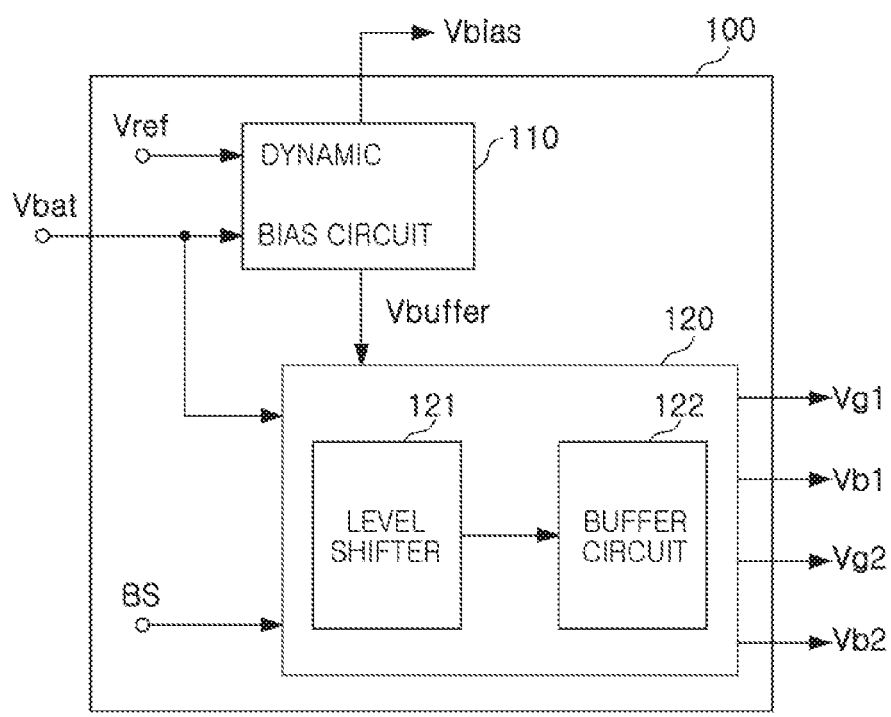
FIG. 11 is a diagram of a voltage generation circuit according to an example.

FIG. 11 is a diagram of a voltage generation circuit according to an example.

Referring to FIG. 11, the voltage generation circuit 100 may generate the first and second gate voltages Vg1 and Vg2, the first and second body voltages Vb1 and Vb2, and the bias voltage Vbias for switching of the first radio frequency switching circuit SW1 according to a band selection signal BS, using the battery voltage Vbat and a reference voltage Vref.

For example, the voltage generation circuit 100 includes a dynamic bias circuit 110 and a switch control circuit 120. The switching control circuit 120 may include a level shifter 121 and a buffer circuit 122.

The level shifter 121 may shift a voltage level of the band selection signal BS using the battery voltage Vbat and a buffer voltage Vbuffer.

The buffer circuit 122 may generate the first and second gate voltages Vg1 and Vg2 for switching of the first radio frequency switching circuit SW1 according to a band selection signal BS level-shifted by the level shifter 121, and generate first and second body voltages Vb1 and Vb2. This is described in more detail in Korean Patent Registration No. 10-1823269.

The examples provide a leakage current reduction type radio frequency switching device capable of blocking a direct current flow by a bias voltage, in order to prevent a current leakage caused by the bias voltage supplied to a drain (or a source) to control a plurality of stacked transistors to enter an off state.

A voltage generation circuit of the radio frequency switching device may be implemented in a computing environment in which a processor (e.g., a central processing unit (CPU), a graphics processing unit (GPU), a microprocessor, an application specific integrated circuit (ASIC), Field programmable gate arrays (FPGAs), etc.), memory (e.g., a volatile memory (e.g., RAM, etc.), nonvolatile memory (e.g., ROM, flash memory, etc.), an input device (e.g., a keyboard, a mouse, a pen, a voice input device, a touch input device, an infrared camera, a video input device, etc.), an output device (e.g., a display, a speaker, a printer, etc.), and a communication connector (e.g. a modem, a network interface card (NIC), an integrated network interface, a wireless frequency transmitter/receiver, an infrared port, an USB connector, etc.) are interconnected to each other (e.g., peripheral component interconnect (PCI), USB, firmware (IEEE 1394), an optical bus structure, network, etc.)

The computing environment may be implemented as a distributed computing environment including a personal computer, a server computer, a handheld or laptop device, a mobile device (a mobile phone, a PDA, a media player, etc.), a multiprocessor system, a consumer electronics device, a minicomputer, a main frame computer, an arbitrarily described system, or a device, but is not limited thereto.

As set forth above, in order to control a plurality of stacked transistors to enter an off state, in a structure for providing a bias voltage supplied to a drain (or a source) and simultaneously providing a zero voltage to a gate, a flow of a direct current is blocked by the bias voltage, and thus the current consumption due to the bias voltage may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switching device comprising:
a first series switching circuit connected between a first terminal and a second terminal;
a first shunt switching circuit connected between one end of the first series switching circuit and a ground;
a voltage generation circuit configured to:
generate a first gate voltage to be output to the first series switching circuit,
generate a second gate voltage to be output to the first shunt switching circuit based on a battery voltage, and
generate a bias voltage, which is higher than the second gate voltage, to control the first shunt switching circuit to enter an off state;
a first resistance circuit connected between a signal line, which is connected between the first terminal and the second terminal, and a bias voltage terminal of the voltage generation circuit; and
a second resistance circuit connected between the bias voltage terminal of the voltage generation circuit and a ground terminal of the first shunt switching circuit,
wherein the second resistance circuit is directly connected to the ground terminal.

2. The radio frequency switching device of claim 1, wherein the first resistance circuit comprises a first resistor connected between the bias voltage terminal of the voltage generation circuit and the signal line, and
wherein the second resistance circuit includes a second resistor connected between the bias voltage terminal of the voltage generation circuit and the ground terminal.

3. The radio frequency switching device of claim 2, wherein a first resistance value of the first resistance circuit is equal to a combined resistance value of the first shunt switching circuit in an off state and a resistance value of the second resistance circuit.

4. The radio frequency switching device of claim 1, wherein the first series switching circuit comprises first to n-th MOS transistors connected in series between the first terminal and the second terminal, and
wherein gates of the first to n-th MOS transistors are configured to receive the first gate voltage from the voltage generation circuit.

5. The radio frequency switching device of claim 1, wherein the first shunt switching circuit comprises first to n-th MOS transistors connected in series between the one end of the first series switching circuit and the ground, and
wherein gates of the first to n-th MOS transistors are configured to receive the second gate voltage from the voltage generation circuit.

6. The radio frequency switching device of claim 1, wherein the voltage generation circuit is configured to:
control an on state of the first series switching circuit and an off state of the first shunt switching circuit in a signal transfer mode, using the first gate voltage, the second gate voltage, and the bias voltage, and
control an off state of the first series switching circuit and an on state of the first shunt switching circuit in a signal off mode, using the first gate voltage, the second gate voltage, and the bias voltage.

7. A radio frequency switching device comprising:
a first series switching circuit connected between a first terminal and a second terminal;
a first shunt switching circuit connected between one end of the first series switching circuit and a ground;
a voltage generation circuit configured to:
generate a first gate voltage to be output to the first series switching circuit,
generate a second gate voltage to be output to the first shunt switching circuit based on a battery voltage, and
generate a bias voltage, which is higher than the second gate voltage, to control the first shunt switching circuit to enter an off state;
a first resistance circuit connected between a signal line, which is connected between the first terminal and the second terminal, and a bias voltage terminal of the voltage generation circuit; and
a first capacitor circuit connected between a ground terminal of the first shunt switching circuit and the ground to block a direct current,
wherein the bias voltage is transmitted to the ground terminal without passing through the first shunt switching circuit.

8. The radio frequency switching device of claim 7, further comprising: a second resistance circuit connected between the bias voltage terminal of the voltage generation circuit and the ground terminal of the first shunt switching circuit.

9. The radio frequency switching device of claim 8, wherein the first resistance circuit comprises a first resistor connected between the bias voltage terminal of the voltage generation circuit and the signal line, and
wherein the second resistance circuit comprises a second resistor connected between the bias voltage terminal of the voltage generation circuit and the ground terminal.

10. The radio frequency switching device of claim 9, wherein a first resistance value of the first resistance circuit is equal to a combined resistance value of the first shunt switching circuit in an off state and a resistance value of the second resistance circuit.

11. The radio frequency switching device of claim 8, wherein the first series switching circuit comprises first to n-th MOS transistors connected in series between the first terminal and the second terminal, and
wherein gates of the first to n-th MOS transistors are configured to receive the first gate voltage from the voltage generation circuit.

12. The radio frequency switching device of claim 8, wherein the first shunt switching circuit comprises first to n-th MOS transistors connected in series between the one end of the first series switching circuit and the ground, and
wherein gates of the first to n-th MOS transistors are configured to receive the second gate voltage from the voltage generation circuit.

13. The radio frequency switching device of claim 8, wherein the voltage generation circuit is configured to:
control an on state of the first series switching circuit and an off state of the first shunt switching circuit in a signal transfer mode, using the first gate voltage, the second gate voltage, and the bias voltage, and
control an off state of the first series switching circuit and an on state of the first shunt switching circuit in a signal off mode, using the first gate voltage, the second gate voltage, and the bias voltage.

14. The radio frequency switching device of claim 8, wherein the first capacitor circuit comprises:
a first capacitor connected between the ground terminal of the first shunt switching circuit and the ground and configured to block the direct current; and an Electro-Static Discharge (ESD) protection circuit connected in parallel to the first capacitor and configured to constantly maintain voltages of both ends of the first capacitor.

15. The radio frequency switching device of claim 8, wherein the first resistance circuit comprises a first MOS transistor always in an off state to provide an off resistance, and wherein the first MOS transistor in the off state is configured to provide an Electro-Static Discharge (ESD) discharge path for protecting the first capacitor circuit from an ESD.

16. A radio frequency switching device comprising:
a radio frequency switching circuit connected between a first terminal and a second terminal; and
a voltage generation circuit configured to generate a first gate voltage, a second gate voltage, and a bias voltage, which is higher than the second gate voltage, for switching the first radio frequency switching circuit according to a band selection signal,
wherein the voltage generation circuit comprises:
a dynamic bias circuit configured to input a battery voltage and a reference voltage and to output the bias voltage and a buffer voltage; and
a switch control circuit configured to input the voltage buffer and to output the first gate voltage and the second gate voltage.

17. The radio frequency switching device according to claim 16, wherein the switch control circuit comprises:
a level shifter configured to shift a voltage level of the band selection signal using the battery voltage and the buffer voltage; and a buffer circuit configured to generate the first gate voltage and the second gate voltage according to the level-shifter band selection signal.

18. The radio frequency switching device according to claim 16, further comprising:
a resistance circuit connected between a bias output terminal of the voltage generation circuit and the radio frequency switching circuit; and
a capacitor circuit connected between the radio frequency switching circuit and a ground.

19. The radio frequency switching device according to claim 18, wherein the capacitor circuit comprises a constant voltage device and a capacitor connected in parallel.

20. A radio frequency switching device comprising:
a radio frequency switching circuit connected between a first terminal and a second terminal;
a voltage generation circuit configured to generate a first gate voltage, a second gate voltage, and a bias voltage, which is higher than the second gate voltage, for switching the first radio frequency switching circuit according to a band selection signal;
a resistance circuit connected between a bias output terminal of the voltage generation circuit and the radio frequency switching circuit; and
a capacitor circuit connected between the radio frequency switching circuit and a ground, wherein the capacitor circuit comprises a constant voltage device and a capacitor connected in parallel.

* * * * *